(12) United States Patent
Lee et al.

(10) Patent No.: US 9,507,226 B2
(45) Date of Patent: Nov. 29, 2016

(54) DISPLAY DEVICE HAVING PARTICULAR SEALANT

(71) Applicant: Samsung Display Co., Ltd., Yongin, Gyeonggi-Do (KR)

(72) Inventors: Hee-Keun Lee, Suwon-si (KR); Myeong Hee Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/741,185

(22) Filed: Jun. 16, 2015

(65) Prior Publication Data
US 2016/0209696 A1 Jul. 21, 2016

(30) Foreign Application Priority Data
Jan. 19, 2015 (KR) ........................ 10-2015-0008683

(51) Int. Cl.
| | | |
|---|---|---|
| *G02F 1/1339* | (2006.01) | |
| *G02F 1/1337* | (2006.01) | |
| *G02F 1/1345* | (2006.01) | |
| *G02F 1/1368* | (2006.01) | |
| *G02F 1/1362* | (2006.01) | |
| *G02F 1/1333* | (2006.01) | |
| *H01L 27/12* | (2006.01) | |

(52) U.S. Cl.
CPC ......... *G02F 1/13454* (2013.01); *G02F 1/1368* (2013.01); *G02F 1/133377* (2013.01); *G02F 1/136286* (2013.01); *H01L 27/124* (2013.01)

(58) Field of Classification Search
CPC .. G02F 1/1339; G02F 1/1341; G02F 1/1345; G02F 1/13351; G02F 1/13394; G02F 2001/13415; G02F 1/1393; G02F 1/133707; G02F 2001/133742
USPC .......................................... 349/153, 190, 130
See application file for complete search history.

(56) References Cited

U.S. PATENT DOCUMENTS 6,275,279 B1* 8/2001 Asuma ................. G02F 1/1341
349/153
6,476,897 B1* 11/2002 Watanabe ........... G02F 1/13454
349/139

FOREIGN PATENT DOCUMENTS

| | | |
|---|---|---|
| JP | 2008-033117 | 2/2008 |
| JP | 2008-242031 | 10/2008 |
| KR | 100688958 | 3/2007 |
| KR | 1020080049193 A | 6/2008 |
| KR | 1020090103240 A | 10/2009 |
| KR | 1020110062992 A | 6/2011 |
| KR | 1020120026880 A | 3/2012 |
| KR | 1020130124827 A | 11/2013 |
| KR | 1020140007202 A | 1/2014 |
| KR | 1020150043604 | 4/2015 |

* cited by examiner

*Primary Examiner* — Mike Qi
(74) *Attorney, Agent, or Firm* — Innovation Counsel LLP

(57) ABSTRACT

A display device according to an exemplary embodiment includes a flexible substrate, a gate line and a data line located on the substrate, a thin film transistor connected to the gate line and the data line, a pixel electrode connected to the thin film transistor, a pad located at an end of the gate line and the data line, a driver connected to the pad, and a sealant covering the pad and the driver, wherein the sealant includes air bubbles or particles therein.

17 Claims, 15 Drawing Sheets

DISPLAY DEVICE HAVING PARTICULAR SEALANT

CROSS-REFERENCE TO RELATED APPLICATION

This application claims priority to and the benefit of Korean Patent Application No. 10-2015-0008683 filed in the Korean Intellectual Property Office on Jan. 19, 2015, the entire contents of which are incorporated herein by reference.

BACKGROUND (a) Technical Field

The present application relates to a display device, and more particularly, to a display device which can prevent a pad from damage due to an external impact.

(b) Description of the Related Art

A liquid crystal display is one of flat panel displays which have been most widely used, and includes two sheets of display panels on which field generating electrodes such as pixel electrodes and common electrodes are formed and a liquid crystal layer interposed therebetween. The liquid crystal display applies an electric field on the liquid crystal layer by applying voltage to the field generating electrodes, and through this, displays images by determining the direction of liquid crystal molecules and controlling the polarization of incident beams.

The two sheets of display panel constructing the liquid crystal display may include a thin film transistor array display panel and a facing display panel. In the thin film transistor array display panel, gate lines transmitting gate signals and data lines transmitting data signals are formed while being intersected, and thin film transistors to which gate lines and data lines are connected and pixel electrodes connected to the thin film transistors may be formed. On the facing display panel, a light blocking member, a color filter, common electrodes, and the like may be formed. In some cases, the light blocking member, the color filter, and the common electrodes may be formed on the thin film transistor array display panel.

Recently, in order to increase a viewer's concentration, a curved liquid crystal display has been developed, and the curved liquid crystal display can be rolled or bent in order to improve portability. During the process of rolling or bending, there is a problem that a pad of the liquid crystal display is damaged.

The above information disclosed in this Background section is only for enhancement of understanding of the background and therefore it may contain information that does not form the prior art that is already known in this country to a person of ordinary skill in the art.

SUMMARY

Embodiments provide a display device which can prevent damage of a pad due to an external impact.

The display device according to an exemplary embodiment includes a flexible substrate, a gate line and a data line located on the substrate, a thin film transistor connected to the gate line and the data line, a pixel electrode connected to the thin film transistor, a pad located at an end of the gate line and the data line, a driver connected to the pad, and a sealant covering the pad and the driver, wherein the sealant includes air bubbles or particles therein.

The display device may further include a roof layer formed on the pixel electrode to be spaced apart from the pixel electrode with a plurality of microcavities, a liquid crystal layer filling the microcavities, and an encapsulation layer located on the roof layer and sealing the microcavities.

The sealant may contact the encapsulation layer.

A number of the air bubbles or the particles per unit area may be more than $20/mm^2$.

A number of the air bubbles or the particles per unit area may be more than $100/mm^2$.

The sealant may include the air bubbles and may not include the particles.

The sealant may include the particles and may not include the air bubbles.

The sealant may include the air bubbles and the particles.

The sealant may include at least two kinds of the particles.

The pad may include a gate pad located at an end portion of the gate line, the driver may include a gate driver configured to generate gate signals, and the gate driver may be connected to the gate pad.

The gate driver may include a chip on film.

The gate driver may include a first circuit board, and a gate driving chip located on the first circuit board.

The pad may include a data pad located at an end part of the data line, the driver may include a data driver configured to generate data signals, and the data driver may be connected to the data pad.

The data driver may include a chip on film.

The data driver may include a second circuit board, and a data driving chip located on the second circuit board.

A number of the air bubbles or the particles per unit area may be more than $20/mm^2$.

A number of the air bubbles or the particles per unit area may be more than $100/mm^2$.

The display device according to an exemplary embodiment has a technical effect of preventing damage to a pad caused by an external impact.

DETAILED DESCRIPTION OF THE EMBODIMENTS

Figure 1A:
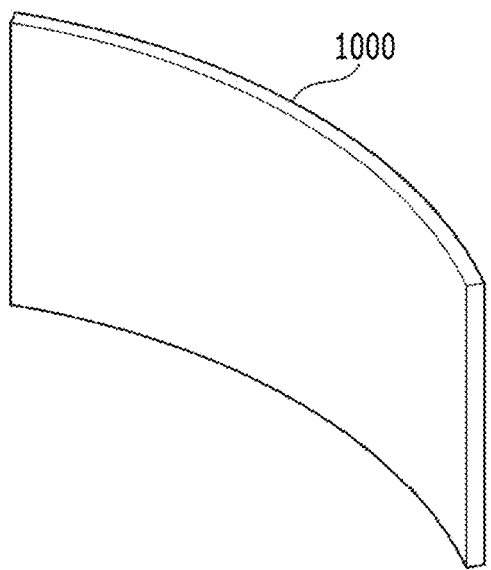
FIGS. 1A and 1B are perspective views illustrating a display device according to an exemplary embodiment.

Hereinafter, the inventive concept will be described more fully with reference to the accompanying drawings, in which exemplary embodiments are shown. However, the inventive concept may be implemented in various forms, and the scope of the inventive concept is not limited the embodiments described herein.

In the drawings, the thickness of layers, films, panels, regions, etc., are exaggerated for clarity. The same reference numerals are designated for identical elements throughout the specification. It will be understood that when an element such as a layer, film, region, or substrate is referred to as being "on" another element, it can be directly on the other element or intervening elements may also be present. On the other hand, when an element is referred to as being "directly on" another element, there are no intervening elements present.

First, referring to FIGS. 1A and 1B, a display device according to an exemplary embodiment will be described below.

Figure 1B:
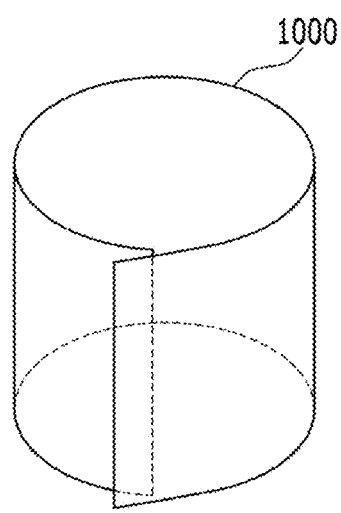

FIGS. 1A and 1B are perspective views illustrating a display device according to an exemplary embodiment.

As shown in FIGS. 1A and 1B, the display device 1000 according to an exemplary embodiment can be bent. A flat display device is manufactured using a planar substrate and used by bending it.

As shown in FIG. 1A, a curved display device may be formed by bending the display device 1000 to have a predefined curvature. Since the curved display device has wider viewing angle than a flat display device, a greater amount of information stimulates visual cells and more visual information is transferred to a brain through the optic nerve. According to this, a sense of reality and concentration can be increased, and can be usefully utilized for a large scale TV and the like.

As shown in FIG. 1B, a cylinder shaped display device may be formed by rolling up the display device 1000. The cylinder shaped display device may decrease volume, and is suitable for a portable device due to easy modification.

Hereinafter, by referring to FIG. 2 to FIG. 4, a display device according to an exemplary embodiment will be described.

Figure 2:
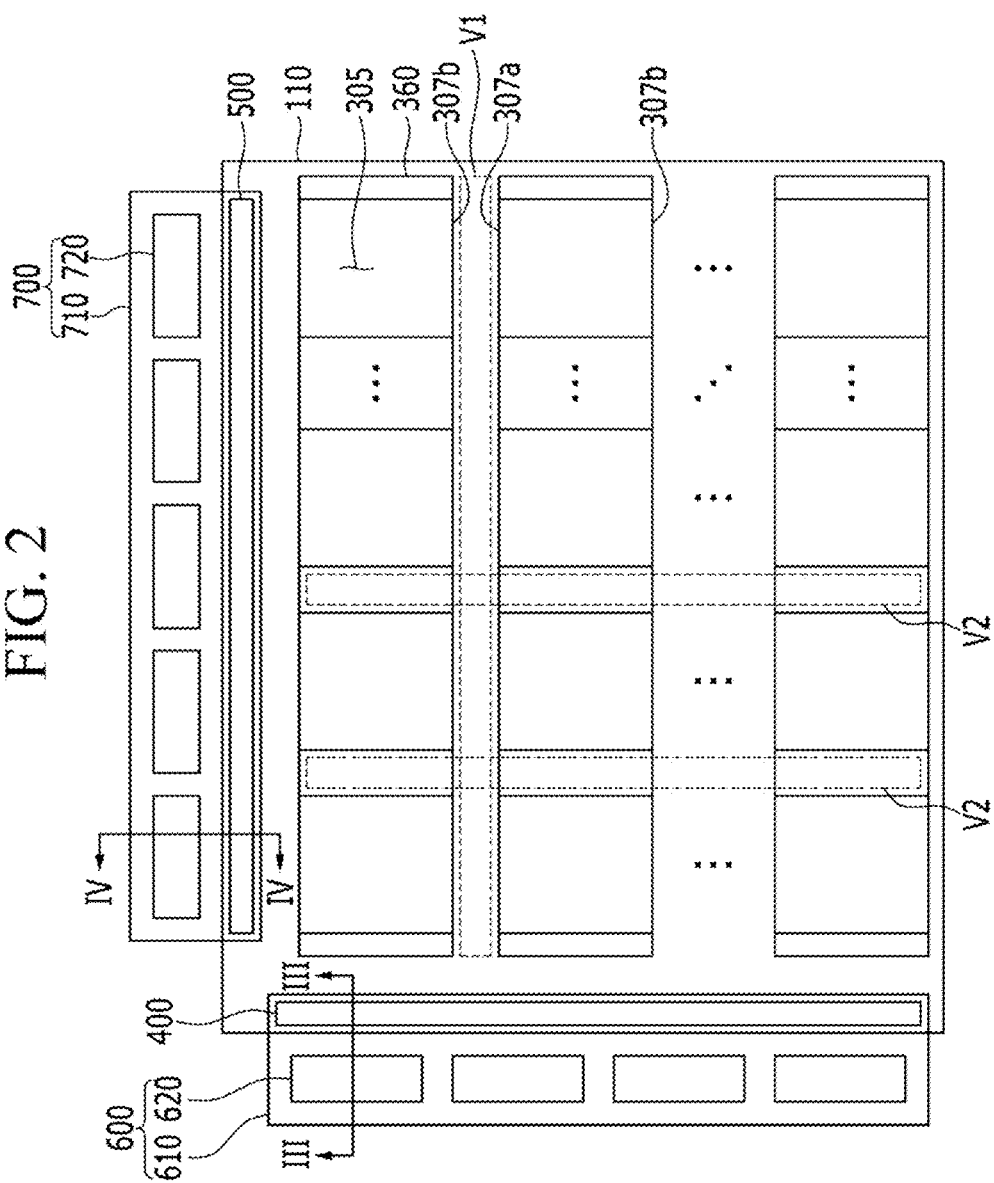
FIG. 2 is a top plan view illustrating a display device according to an exemplary embodiment.
Figure 3:
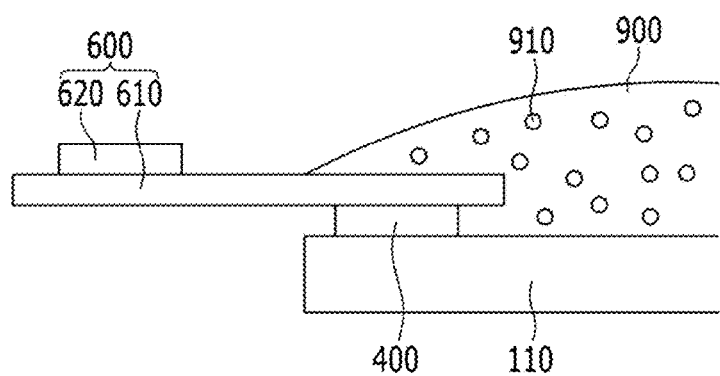
FIG. 3 is a sectional view illustrating a display device according to an exemplary embodiment cut along line III-III of FIG. 2.
Figure 4:
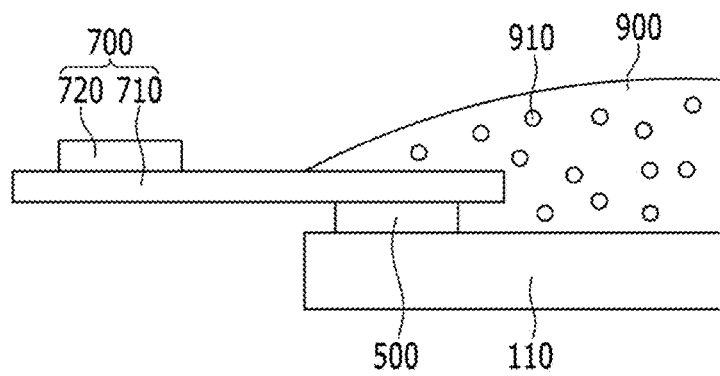
FIG. 4 is a sectional view illustrating a display device according to an exemplary embodiment cut along line IV-IV of FIG. 2.

FIG. 2 is a top plan view illustrating a display device according to an exemplary embodiment, FIG. 3 is a sectional view illustrating a display device according to an exemplary embodiment cut along line III-III of FIG. 2, and FIG. 4 is a sectional view illustrating a display device according to an exemplary embodiment cut along line IV-IV of FIG. 2.

As shown in FIG. 2, the display device according to an exemplary embodiment includes a substrate 110 made of a material such as glass, plastic, or the like. The substrate 110 is made of a flexible material.

A microcavity 305 which is covered by a roof layer 360 is formed on the substrate 110. The roof layer 360 is extended in the row direction, and a plurality of microcavities 305 are formed under one roof layer 360.

The microcavities 305 may be disposed in a matrix form, a first valley V1 is located between microcavities 305 adjacent to each other in column direction, and a second valley V2 is located between microcavities 305 adjacent to each other in row direction.

A plurality of roof layers 360 are separated across the first valley V1. The microcavity 305 may be exposed to the outside, not covered by the roof layer 360 on the part contacting the first valley V1. This is referred to as injection holes 307a and 307b.

The injection holes 307a and 307b are formed at both edges of the microcavity 305. The injection holes 307a and 307b include a first injection hole 307a and a second injection hole 307b. The first injection hole 307a is formed to extend to and expose the side of the first edge of the microcavity 305, and the second injection hole 307b is formed to extend to and expose the side of the second edge of the microcavity 305. The side of the first edge and the side of the second edge of the microcavity 305 face each other.

Each roof layer 360 is formed to be located apart from the substrate 110 between the adjacent second valleys V2, and forms the microcavity 305. That is, the roof layer 360 is formed to cover the other side surfaces of the microcavity 305 except for the side surfaces of the first edge and the second edge where the injection holes 307a and 307b are formed.

The layout may be variously changeable for the aforementioned microcavity 305, the roof layer 360, the first valley V1, second valley V2, the injection holes 307a and 307b, and so on. For example, a plurality of roof layers 360 may be connected to each other at the first valley V1, and a part of each roof layer 360 is formed to be separated from the substrate 110 at the second valley V2 and adjacent microcavities 305 can be accordingly connected to each other.

Pads 400 and 500 are located on the edge of the substrate 110. The pads 400 and 500 include a gate pad 400 and a data pad 500. The gate pad 400 is connected to a gate line 121, to be described later, and the data pad 500 is connected to a data line 171, to be described later.

In the plan view, it is shown that the gate pad 400 is located on the left edge of the substrate 110 and the data pad 500 is located on the upper edge of the substrate 110, but the embodiments are not limited thereto, and the locations of the gate pad 400 and data pad 500 may be variously modified. The gate pad 400 and the data pad 500 may be located on the same edge.

Drivers 600 and 700 that are connected to the respective pads 400 and 500 are formed. The drivers 600 and 700 include a gate driver 600 and a data driver 700.

The gate driver 600 is connected to the gate pad 400. The gate driver 600 generates gate signals and delivers them to the gate lines 121. The gate driver 600 includes a first circuit board 610 and a gate driving chip 620 that is located on the first circuit board 610. The gate driver 600 may be formed as a chip on film (COF).

The data driver 700 is connected to the data pad 500. The data driver 700 generates data signals and delivers them to the data lines 171. The data driver 700 includes a second circuit board 710 and a data driving chip 720 that is located on the second circuit board 710. The data driver 700 may be formed as a chip on film (COF).

A sealant 900 is located on the pads 400 and 500 and the drivers 600 and 700. The sealant 900 covers the pads 400 and 500 and the drivers 600 and 700. The sealant 900 includes air bubbles 910 therein. A plurality of air bubbles 910 are located inside of the sealant 900, and the number of the air bubbles 910 per unit area may be more than about 20 bubbles/mm$^2$. That is, 20 or more air bubbles 910 are located within an area of 1 mm$^2$. Preferably, the number of air bubbles 910 per unit area may be about 100 bubbles/mm$^2$ or more.

The size of the air bubble 910 may be various. The size of the air bubbles 910 may be uniform or different from each other. For example, the size of the air bubbles 910 may be 1 nm to 10 mm.

The sealant 900 may protect the pads 400 and 500 and the drivers 600 and 700 from external impact. For example, it may prevent them from being physically forced or from inflowing moisture, etc. However, if a force applied to the substrate 110 is sufficiently strong to bend it, the pads 400 and 500 may be damaged absent the sealant 900. In the present exemplary embodiment, the air bubbles 910 are included inside of the sealant 900, and damage to the pads 400 and 500 may be prevented owing to the buffer action of the air bubbles 910.

The higher the number of air bubbles 910 per unit area is, the bigger the effect of the buffer is.

A pixel of a display device according to an exemplary embodiment will now be briefly described with reference to FIG. 5.

Figure 5:
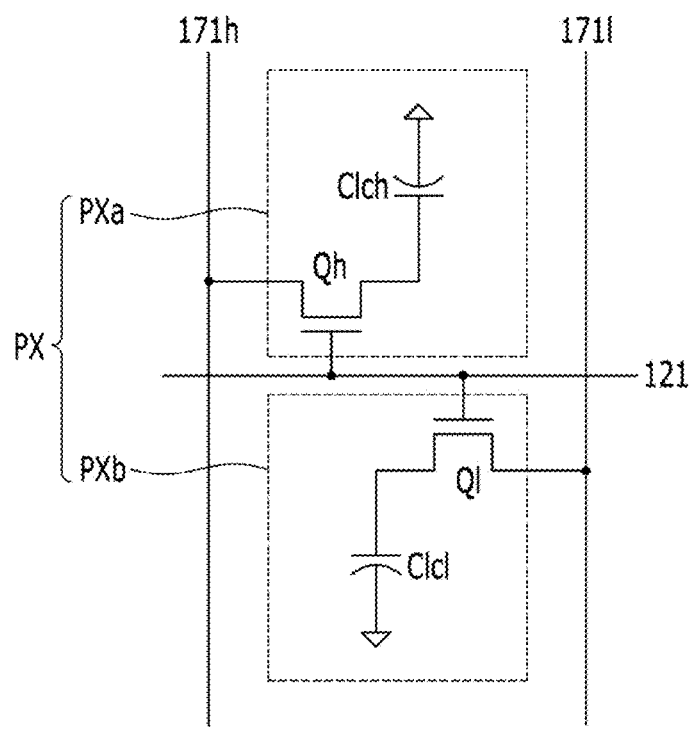
FIG. 5 is an equivalent circuit diagram of one pixel of a liquid crystal display according to an exemplary embodiment.

FIG. 5 is an equivalent circuit diagram of a pixel PX of the display device according to an exemplary embodiment.

The display device according to an exemplary embodiment includes a plurality of signal lines 121, 171h, and 171l, and a pixel PX that is connected to them. Although not shown, a plurality of pixels PX may be arranged in a matrix shape including a plurality of pixel PX rows and a plurality of pixel PX columns.

Each pixel PX may include a first sub-pixel PXa and a second sub-pixel PXb. The first sub-pixel PXa and the second sub-pixel PXb may be disposed up and down. The first valley V1 may be located between the first sub-pixel PXa and the second sub-pixel PXb along the pixel row direction, and the second valley V2 may be located between a plurality of pixel columns.

The signal lines 121, 171h, and 171l include the gate line 121 that delivers gate signals, and a first data line 171h and a second data line 171l that deliver different data voltages.

The first thin film transistor Qh, which is connected to the gate line 121 and the first data line 171h is formed, and the second thin film transistor Ql, which is connected to the gate line 121 and the second data line 171l is formed.

The first liquid crystal capacitor Clch that is connected to the first thin film transistor Qh is formed in the first sub-pixel PXa, and the second liquid crystal capacitor Clcl that is connected to the second thin film transistor Ql is formed in the second sub-pixel PXb.

A first terminal of the first thin film transistor Qh is connected to the gate line 121, a second terminal is connected to the first data line 171h, and a third terminal is connected to the first liquid crystal capacitor Clch.

The first terminal of the second thin film transistor Ql is connected to the gate line 121, the second terminal is connected to the second data line 171l, and the third terminal is connected to the second liquid crystal capacitor Clcl.

Looking at an operation of the display device according to an exemplary embodiment, if the gate-on voltage is applied to the gate line 121, it makes the first thin film transistor Qh and the second thin film transistor Ql which are connected thereto enter a turn-on state, and the first and second liquid crystal capacitors Clch and Clcl are successively charged by different data voltages which are delivered through the first and second data lines 171h and 171l. The data voltage that is delivered through the second data line 171l is lower than the data voltage that is delivered through the first data line 171h. Therefore, by the second liquid crystal capacitor Clcl being charged by a lower voltage than that of the first liquid crystal capacitor Clch, visibility at side surface can be improved.

However, the embodiments are not limited thereto, and the layout design of thin film transistors which are used for applying different voltages to the two sub-pixels PXa and PXb may be variously modified. The pixel PX may include two or more sub-pixels, or may include a single pixel.

Hereinafter, referring to FIG. 6 to FIG. 8, a structure of a pixel of a display device according to an exemplary embodiment will be described.

Figure 6:
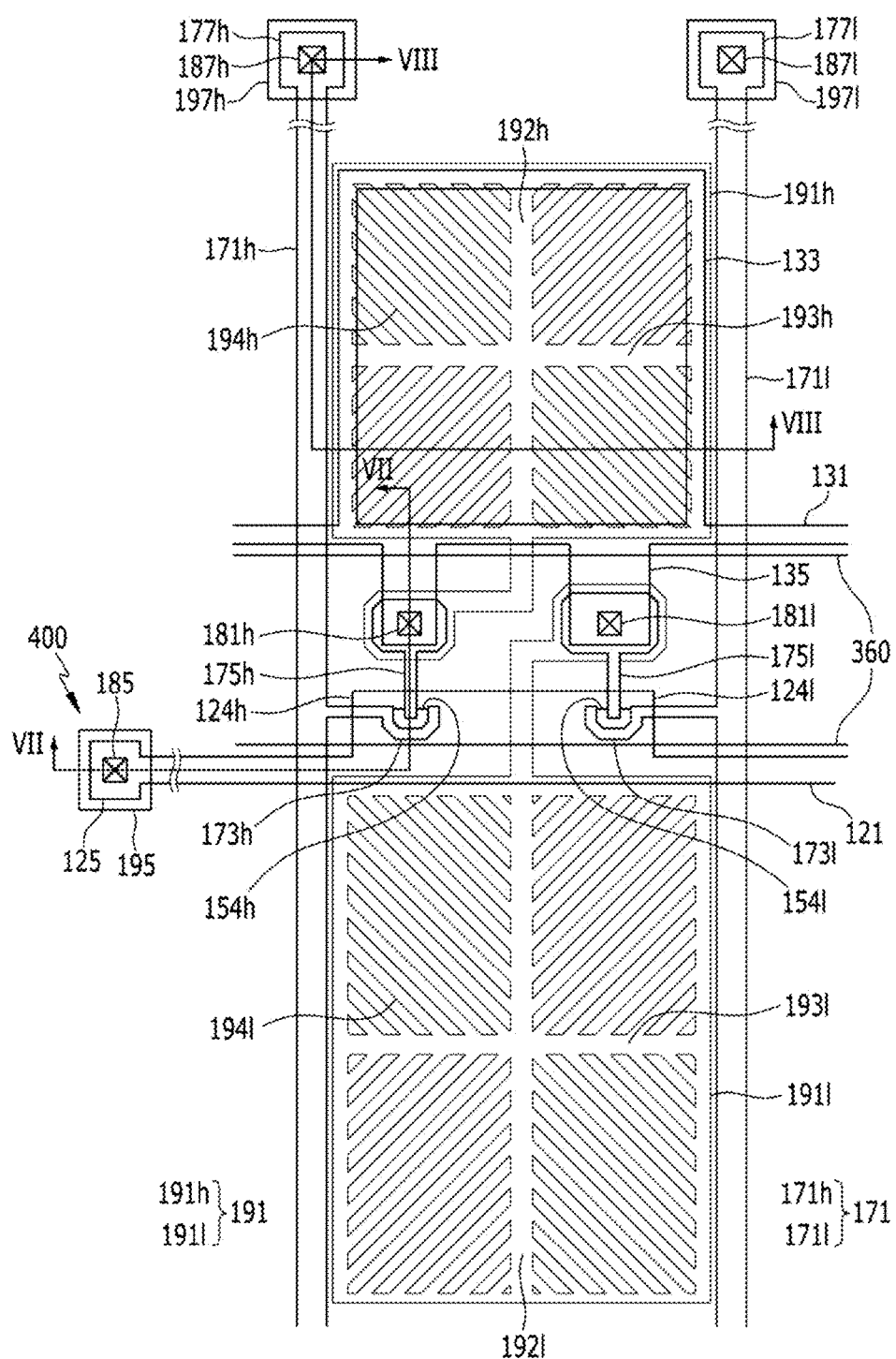
FIG. 6 is a layout view illustrating a part of the display device according to an exemplary embodiment.
Figure 7:
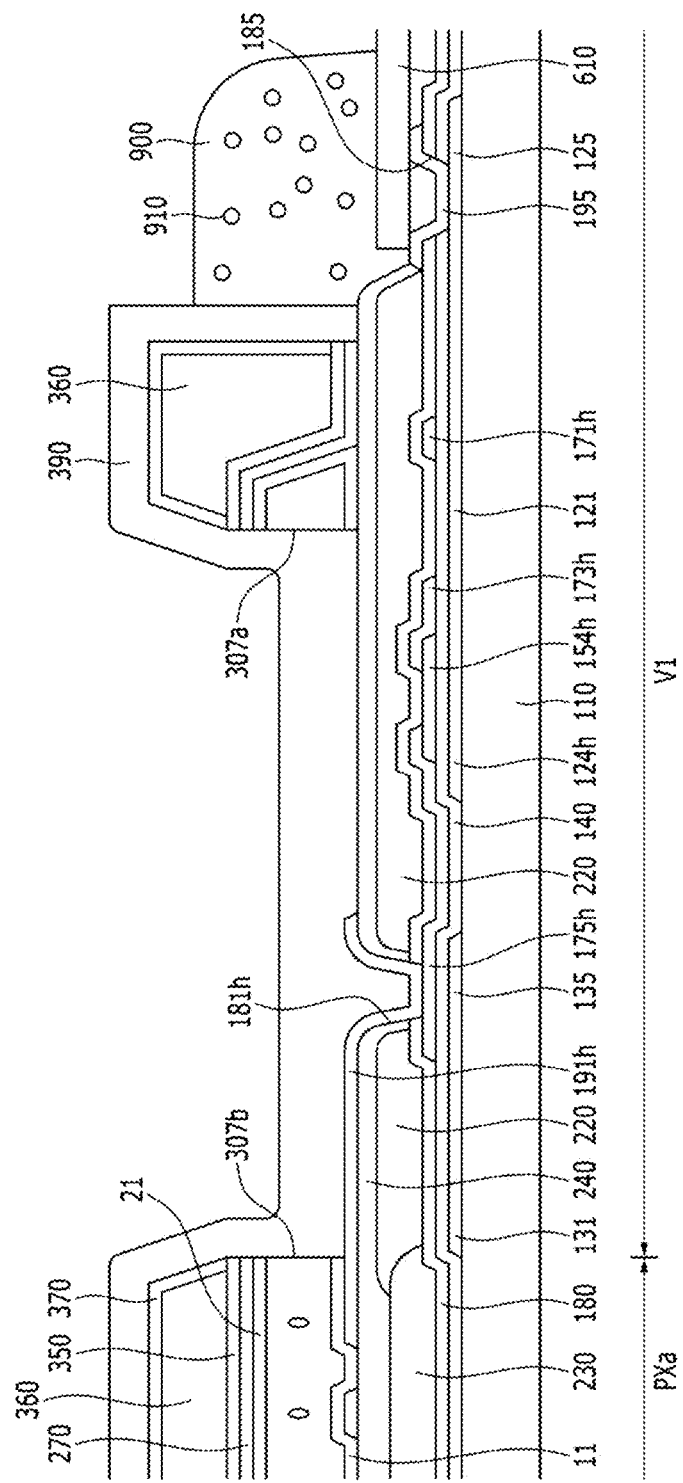
FIG. 7 is a cross-sectional view of the display device of FIG. 6, which is cut along the line VII-VII according to an exemplary embodiment.
Figure 8:
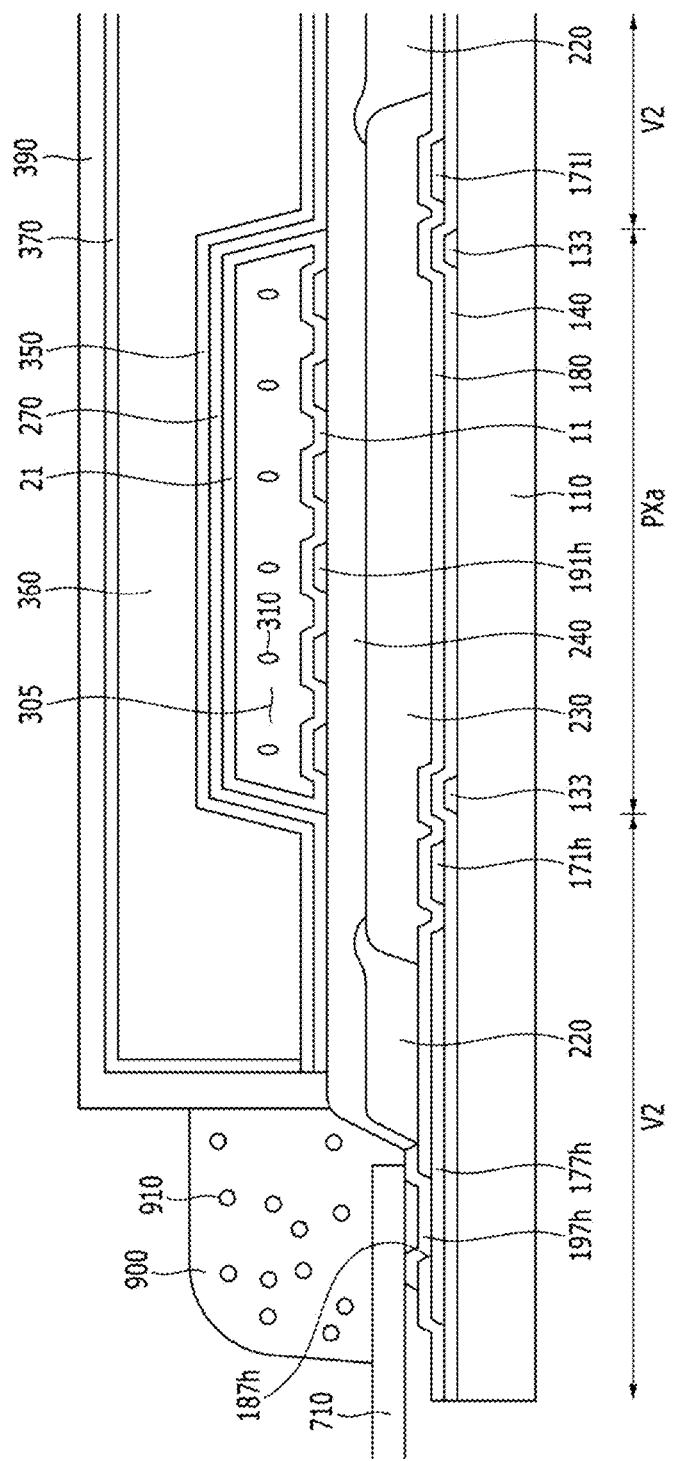
FIG. 8 is a cross-sectional view of the display device of FIG. 6, which is cut along the line VIII-VIII according to an exemplary embodiment.

FIG. 6 is a layout view illustrating a part of the display device according to an exemplary embodiment, FIG. 7 is a cross-sectional view of the display device which is cut along the line VII-VII according to an exemplary embodiment, and FIG. 8 is a cross-sectional view of the display device which is cut along the line VII-VIII according to an exemplary embodiment.

Referring to FIG. 6 to FIG. 8, the gate line 121 and a first gate electrode 124h and a second gate electrode 124l which are protruded from the gate line 121 are formed on the substrate 110.

The gate line 121 is extended in a first direction and delivers the gate signals. The gate line 121 is located between the two microcavities 305 which are adjacent to each other in a column direction. That is, the gate line 121 is located at the first valley V1. The first gate electrode 124h and the second gate electrode 124l are protruded over the gate line 121 on the plan view. The first gate electrode 124h and the second gate electrode 124l are connected to each other and formed as a protrusion part. However, the embodiments are not limited thereto, and the protrusion shape of the first gate electrode 124h and the second gate electrode 124l may be variously modified.

A gate pad 125 that is connected to the gate line 121 is formed on the substrate 110. The gate pad 125 is connected to an end part of the gate line 121. The gate pad 125 may be formed to have a wider width than the gate line 121. The gate signals are applied to the gate pad 125 by the gate driver 600, delivered to the gate line 121 by the gate pad 125, and applied to the first gate electrode 124h and the second gate electrode 124l by the gate line 121.

A storage electrode line 131 and storage electrodes 133 and 135 which are protruded from the storage electrode line 131 are further formed on the substrate 110.

The storage electrode line 131 is extended in the same direction of the gate line 121 and formed to be spaced apart from the gate line 121. A constant voltage may be applied to the storage electrode line 131. The storage electrode 133 that is protruded over the storage electrode line 131 is formed to surround the edges of the first sub-pixel PXa. The storage electrode 135 that is protruded under the storage electrode line 131 is formed to be adjacent to the first gate electrode 124h and the second gate electrode 124l.

A gate insulating layer 140 is formed on the gate line 121, the first gate electrode 124h, the second gate electrode 124l, the storage electrode line 131 and the storage electrodes 133 and 135. The gate insulating layer 140 may be formed of an inorganic insulating material such as a silicon nitride (SiNx), a silicon oxide (SiOx), etc. Additionally, the gate insulating layer 140 may be a single layer or multilayer.

A first semiconductor 154h and a second semiconductor 154l are formed on the gate insulating layer 140. The first semiconductor 154h may be located on the first gate electrode 124h, and the second semiconductor 154l may be located on the second gate electrode 124l. The first semiconductor 154h may be formed under the first data line 171*h*, and the second semiconductor 154*l* may be formed under the second data line 171*l*. The first semiconductor 154*h* and the second semiconductor 154*l* may be formed of amorphous silicon, polycrystalline silicon, a metal oxide, etc.

An ohmic contact member (not shown may be further formed on each of the first semiconductor 154*h* and the second semiconductor 154*l*. The ohmic contact member may be formed of a material such as silicide or n+ hydrogenated amorphous silicon that is doped with a high concentration of an n-type impurity.

The first data line 171*h*, the second data line 171*l*, a first source electrode 173*h*, a first drain electrode 175*h*, a second source electrode 173*l*, and a second drain electrode 175*l* are formed on the first semiconductor 154*h*, the second semiconductor 154*l*, and the gate insulating layer 140.

The first data line 171*h* and the second data line 171*l* deliver data signals and are extended to the second direction to cross the gate line 121 and the storage electrode line 131. The data line 171 is located between the two microcavities 305 which are adjacent to each other in row direction. That is, the data line 171 is located at the second valley V2.

The first data line 171*h* and the second data line 171*l*, collectively referred to as a data line 171, deliver different data voltages. For example, the data voltage delivered by the second data line 171*l* is lower than the date voltage delivered by the first data line 171*h*.

The first source electrode 173*h* is formed to be protruded over the first gate electrode 124*h* from the first data line 171*h*, and the second source electrode 173*l* is formed to be protruded over the second gate electrode 124*l* from the second data line 171*l*. The first drain electrode 175*h* and the second drain electrode 175*l* include a wide end and the other end of a rod shape. The wide end parts of the first drain electrode 175*h* and the second drain electrode 175*l* are overlapped with the storage electrode 135 that is protruded under the storage electrode line 131. The other ends of a stick shape of the first drain electrode 175*h* and the second drain electrode 175*l* are respectively surrounded in a part by the first source electrode 173*h* and the second source electrode 173*l*.

The first and the second gate electrodes 124*h* and 124*l*, the first and the second source electrodes 173*h* and 173*l*, and the first and the second drain electrodes 175*h* and 175*l* respectively constitute the first and second thin film transistors (TFT) Qh and Ql with the first and second semiconductors 154*h* and 154*l*. The channel of the first and second thin film transistors Qh and Ql is formed on each of the semiconductors 154*h* and 154*l* between each of the source electrodes 173*h* and 173*l* and each of the drain electrode 175*h* and 175*l*.

Data pads 177*h* and 177*l* which are connected to the data line 171 may be further formed. The data pads 177*h* and 177*l* include a first data pad 177*h* and a second data pad 177*l*. The first data pad 177*h* is connected to an end part of the first data line 171*h*. The second data pad 177*l* is connected to an end part of the second data line 171*l*. The data pads 177*h* and 177*l* may be formed to have a wider width than the data line 171. The data signals are applied to the data pads 177*h* and 177*l* by the data driver 700, delivered to the data lines 171*h* and 171*l* by the data pads 177*h* and 177*l*, and applied to the source electrodes 173*h* and 173*l* through the data lines 171*h* and 171*l*.

A passivation layer 180 is formed on: the first semiconductor 154*h* that is exposed between the first source electrode 173*h* and the first drain electrode 175*h*; the first source electrode 173*h*; and the first drain electrode 175*h*. The passivation layer 180 is also formed on: the second semiconductor 154*l* that is exposed between the second source electrode 173*l* and the second drain electrode 175*l*; the second source electrode 173*l*; and the second drain electrode 175*l*. The passivation layer 180 may be formed of an organic insulating material or an inorganic insulating material, and may be a single layer or multilayer.

A color filter 230 is formed on the passivation layer 180 within each pixel PX.

Each color filter 230 may display any one of three primary colors of red, green, and blue. The color filter 230 is not limited to the three primary colors of red, green, and blue, but may display cyan, magenta, yellow, white, etc. The color filter 230 may not be formed at the first valley V1 and/or the second valley V2.

A light blocking member 220 is formed in the region between the adjacent color filters 230. The light blocking member 220 is formed on the boundary of the pixels PX and the thin film transistors Qh and Ql and may prevent light leakage. That is, the light blocking member 220 may be formed at the first valley V1 and the second valley V2. The color filter 230 and the light blocking member 220 may be overlapped at a part of the region.

A first insulating layer 240 may be further formed on the color filter 230 and the light blocking member 220. The first insulating layer 240 may be formed of an organic insulating material and play a role of making the upper side of the color filter 230 and the light blocking member 220 flat. The first insulating layer 240 may be formed with a double layer including the layer that is formed of an organic insulating material and a layer that is formed of an inorganic insulating material. The first insulating layer 240 may be omitted in some cases.

A first contact hole 181*h* that extends to and exposes the wide end of the first drain electrode 175*h* and a second contact hole 181*l* that exposes the wide end of the second drain electrode 175*l* are formed on the passivation layer 180 and the first insulating layer 240. A third contact hole 185 that extends to and exposes at least a part of the gate pad 125 is formed in the gate insulating layer 140, the passivation layer 180, and the first insulating layer 240. A fourth contact hole 187*h* that extends to and exposes at least a part of the first data pad 177*h* and a fifth contact hole 187*l* that extends to and exposes at least a part of the second data pad 177*l* is formed in the passivation layer 180 and the first insulating layer 240.

A pixel electrode 191 is formed on the first insulating layer 240. The pixel electrode 191 may be formed of a transparent metal oxide such as indium tin oxide (ITO), indium zinc oxide (IZO), and so on.

The pixel electrode 191 includes a first sub-pixel electrode 191*h* and a second sub-pixel electrode 191*l* which are divided from each other having the gate line 121 and the storage electrode line 131 between them. The first sub-pixel electrode 191*h* and the second sub-pixel electrode 191*l* are disposed above and under the pixel PX with the gate line 121 and the storage electrode line 131 as the center. That is, the first sub-pixel electrode 191*h* and the second sub-pixel electrode 191*l* are separated while having the first valley V1 between them. The first sub-pixel electrode 191*h* is located at the first sub-pixel PXa and the second sub-pixel electrode 191*l* is located at the second sub-pixel PXb.

The first sub-pixel electrode 191*h* is connected to the first drain electrode 175*h* through the first contact hole 181*h*, and the second sub-pixel electrode 191*l* is connected to the second drain electrode 175*l* through the second contact hole 181*l*. Therefore, when the first thin film transistor Qh and the second thin film transistor Ql are turned on, different data voltages are applied on the first sub-pixel electrode 191h and the second sub-pixel electrode 191l from the first drain electrode 175h and the second drain electrode 175l, respectively.

The overall shape of each of the first sub-pixel electrode 191h and the second sub-pixel electrode 191l is quadrangular. Each of the first sub-pixel electrode 191h and the second sub-pixel electrode 191l includes a cross-shaped stem part including horizontal stem parts 193h and 193l and vertical stem parts 192h and 192l. Additionally, the first sub-pixel electrode 191h and the second sub-pixel electrode 191l include a plurality of fine branch parts 194h and 194l.

The pixel electrode 191 is divided into four sub-areas by the horizontal stem parts 193h and 193l and the vertical stem parts 192h and 192l. The fine branch parts 194h and 194l are obliquely extended from the horizontal stem parts 193h and 193l and the vertical stem parts 192h and 192l, and the angle of the extended direction may be about 45 degrees or 135 degrees with respect to the gate line 121 or the horizontal stem parts 193h and 193l. The direction in which the fine branch parts 194h and 194l are extended toward the two adjacent sub-areas may be orthogonal to each other.

In the present exemplary embodiment, the first sub-pixel electrode 191h and the second sub-pixel electrode 191l may further an include exterior stein part that surrounds an exterior of the first sub-pixel PXa and the second sub-pixel PXb, respectively.

Also, an auxiliary gate pad 195, a first auxiliary data pad 197h and a second auxiliary data pad 197l may further be formed on the first insulating layer 240. The auxiliary gate pad 195, the first auxiliary data pad 197h and the second auxiliary data pad 197l may be located on the same layer with the pixel electrode 191, and may be formed of the same material.

The auxiliary gate pad 195 is located on the gate pad 125 and connected to the gate pad 125 through the third contact hole 185. The gate pad 125 and the auxiliary gate pad 195 form the gate pad 400 described above.

The first auxiliary data pad 197h is located on the first data pad 177h and connected to the first data pad 177h through the fourth contact hole 187h. The second auxiliary data pad 197l is located on the second data pad 177l and connected to the second data pad 177l through the fifth contact hole 187l. The first data pad 177h, the second data pad 177l, the first auxiliary data pad 197h, and the second auxiliary data pad 197l form the data pad 500 described above.

The layout of the pixel, the structure of the thin film transistor, and the shape of the pixel electrode described above are only examples, and the embodiments are not limited thereto and may be variously modified.

A common electrode 270 is formed on the pixel electrode 191 while being spaced apart from the pixel electrode 191 by a predefined distance. A microcavity 305 is formed between the pixel electrode 191 and the common electrode 270. That is, the microcavity 305 is surrounded by the pixel electrode 191 and the common electrode 270. The common electrode 270 is formed on the microcavity 305 and at the second valley V2 in a row direction. The common electrode 270 is formed to cover the upper surface and the side surface of the microcavity 305. The width and area of the microcavity 305 may be variously modified according to the size and resolution of the display device.

However, the embodiments are not limited thereto, and an insulating layer may be formed between the pixel electrode 191 and the common electrode 270. The microcavity 305 may be formed on the common electrode 270.

The common electrode 270 may be formed of a transparent metal oxide such as indium tin oxide (ITO), indium zinc oxide (IZO), and so on. A constant voltage may be applied to the common electrode 270, and an electric field may be formed between the pixel electrode 191 and the common electrode 270.

Alignment layers 11 and 21 are formed on the pixel electrode 191 and under the common electrode 270.

The alignment layers 11 and 21 include a first alignment layer 11 and a second alignment layer 21. The first alignment layer 11 and the second alignment layer 21 may be vertical alignment layers, and may be formed of alignment materials such as polyamic acid, polysiloxane, polyimide, etc. The first and second alignment layers 11 and 21 may be connected in a side wall of an edge of the microcavity 305.

The first alignment layer 11 is formed on the pixel electrode 191. The first alignment layer 11 may be formed directly on the first insulating layer 240 which is not covered by the pixel electrode 191.

The second alignment layer 21 is formed under the common electrode 270 facing the first alignment layer 11.

A liquid crystal layer which is made up of liquid crystal molecules 310 is formed within the microcavity 305 located between the pixel electrode 191 and the common electrode 270. The liquid crystal molecules 310 have negative dielectric anisotropy, and may be aligned in the vertical direction of the substrate 110 in a state that the electric field is not applied. That is, vertical alignment may be formed.

The first sub-pixel electrode 191h and the second sub-pixel electrode 191l to which the data voltage is applied generate an electric field with the common electrode 270 and determine the direction of the liquid crystal molecules 310 located within the microcavity 305 between the two electrodes 191 and 270. According to the direction of the liquid crystal molecules 310 determined in like way, the luminance of light which passes through the crystal layer is varied.

A second insulating layer 350 may be further formed on the common electrode 270. The second insulating layer 350 may be formed of an inorganic insulating material such as a silicon nitride (SiNx), a silicon oxide (SiOx), and so on, but may be omitted in some cases.

A roof layer 360 is formed on the second insulating layer 350. The roof layer 360 may be formed of an organic material. The roof layer 360 is formed in a row direction, and is formed on the microcavity 305 and at the second valley V2. The roof layer 360 is formed to cover the upper surface and the side surface of the microcavity 305. The roof layer 360 is hardened by a hardening process, and may play a role of maintaining the shape of microcavity 305. The roof layer 360 is formed to be spaced apart from the pixel electrode 191 and the microcavity 305 therebetween.

The common electrode 270 and the roof layer 360 are formed in order to not cover a part of the side surface of the edges of the microcavity 305, the part of the microcavity 305 that is not covered by the common electrode 270 and the roof layer 360 is referred to as injection holes 307a and 307b. The injection holes 307a and 307b include the first injection hole 307a that extends to and exposes the side surface of the first edge of the microcavity 305 and the second injection hole 307b that extends to and exposes the side surface of the second edge of microcavity 305. The first edge and the second edge face each other, and for example, the first edge may be the upper edge of the microcavity 305 and the second edge may be the lower edge of the microcavity 305 on the floor plan. In the manufacturing process of the display device, the microcavity 305 may be exposed through the injection holes 307a and 307b, and an aligning agent, a liquid crystal material, etc. may be injected into the microcavity 305 through the injection holes 307a and 307b.

A third insulating layer 370 may be further formed on the roof layer 360. The third insulating layer 370 may be formed of an inorganic insulating material such as a silicon nitride (SiNx), a silicon oxide (SiOx), and so on. The third insulating layer 370 may be formed to cover the upper surface and/or the side surface of the roof layer 360. The third insulating layer 370 plays a role of protecting the roof layer 360 that is formed of organic materials, and may be omitted in some cases.

An encapsulation layer 390 is formed on the third insulating layer 370. The encapsulation layer 390 is formed to cover the injection holes 307a and 307b that expose a part of the microcavity 305 to the outside. That is, the encapsulation layer 390 is able to seal the microcavity 305 in order to prevent the liquid crystal molecules 310 that are formed inside of the microcavity 305 from leaking out. Since the encapsulation layer 390 may contact the liquid crystal molecules 310, it is suitable to be formed of a material that does not react with the liquid crystal molecules 310. For example, the encapsulation layer 390 may be formed of parylene, etc.

The encapsulation layer 390 may be a multilayer such as a double layer, a triple layer, etc. The double layer may include two layers that are formed of different materials. The triple layer may include three layers, and each of neighboring layers is formed of a different material. For example, the encapsulation layer 390 may include a layer that is made up of an organic insulating material and a layer that is made up of an inorganic insulating material.

The auxiliary gate pad 195, the first auxiliary data pad 19M, and the second auxiliary data pad 197l are not covered by the encapsulation layer 390 but are exposed to the outside. A first circuit board 610 is located on the auxiliary gate pad 195, and a second circuit board 710 is located on the first auxiliary data pad 197h and the second auxiliary data pad 197l. A sealant 900 is located on the auxiliary gate pad 195, the first auxiliary data pad 197h, the second auxiliary data pad 197l, the first circuit board 610, and the second circuit board 710. The sealant 900 includes air bubbles 910 therein. The sealant 900 touches the encapsulation layer 390.

Although not shown, a polarizer may be further formed on the upper side and the bottom side of the display device. The polarizer may be made up of a first polarizer and a second polarizer. The first polarizer may adhere to the bottom side of the substrate 110, and the second polarizer may adhere to the encapsulation layer 390.

It is described that the sealant includes air bubbles in the above description, but the embodiments are not limited thereto, and the sealant may include other materials. Hereinafter, various materials included in the sealant will be described with reference to FIG. 9 to FIG. 12.

FIG. 9 to FIG. 12 are cross-sectional views illustrating a part of a display device according to an exemplary embodiment. FIG. 9 to FIG. 12 illustrate a boundary of the gate pad 400.

Figure 9:
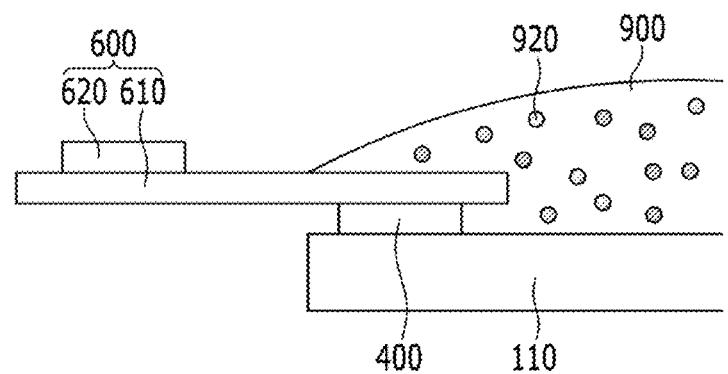
FIGS. 9, 10, 11, and 12 are cross-sectional views illustrating a part of a display device according to an exemplary embodiment.

As shown in FIG. 9, the gate pad 400 is located on the substrate 110 and connected to the gate driver 600. The sealant 900 covers the gate pad 400 and the gate driver 600. The sealant 900 includes first particles 920 located therein. The number of the first particles 920 per unit area may be about 20 particles/mm² or more. That is, more than 20 first particles 920 may be located within an area of 1 mm². Preferably, the number of the first particles 920 per unit area may be about 100 particles/mm² or more. Since the sealant 900 includes the first particles 920, its strength is increased and damage of the gate pad 400 may be prevented. When the number of the first particles 920 per unit area is higher, the strength is greater.

Figure 10:
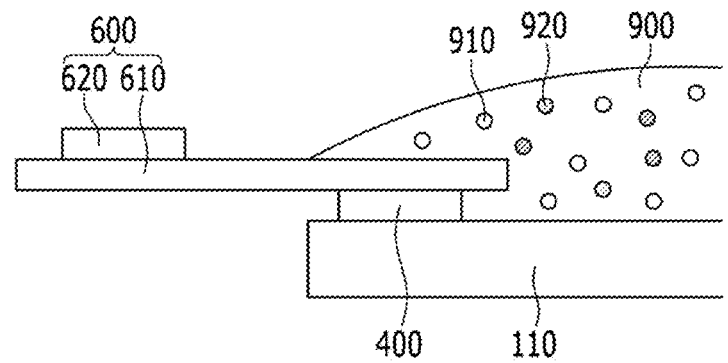

As shown in FIG. 10, the sealant 900 includes the air bubbles 910 and the first particles 920 located inside. The number of air bubbles 910 and first particle 920 per unit area is about 20/mm² or more. That is, 20 air bubbles 910 and first particles 920 or more may be located within an area of 1 mm². Preferably, the number of air bubbles 910 and first particle 920 per unit area may be about 100/mm² or more. Since the sealant 900 includes the air bubbles 910 and the first particles 920 together, the damage to the gate pad 400 may be prevented by improving a buffering effect and strength.

Figure 11:
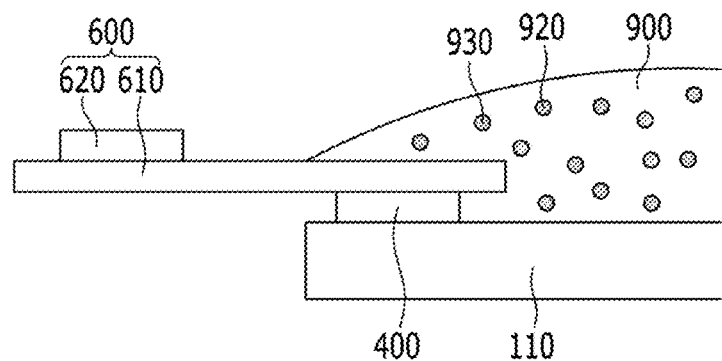

As shown in FIG. 11, the sealant 900 includes the first particles 920 and second particles 930 located therein. The first particles 920 and the second particles 930 may be formed of different materials. In addition, other particles in addition to the first particles 920 and the second particles 930 may be included inside of the sealant 900. That is, the sealant 900 may include more than two kinds of particles. The number of the first particles 920 and the second particles 930 per unit area may be about 20 particles/mm² or more. That is, 20 or more of the first particles 920 and the second particles 930 may be located within an area of 1 mm². Preferably, the number of the first particles 920 and the second particles 930 per unit area may be about 100 particles/mm² or more. Since the sealant 900 includes the first particles 920 and the second particles 930, the strength can be increased and damage to the gate pad 400 can be prevented.

The size of the first particles 920 and the second particles 930 may be various. The size of the first particles 920 and the second particles 930 may be uniform or different from each other. For example, the size of the first particles 920 and the second particles 930 may be 1 nm to 10 mm. The material of the first particles 920 and the second particles 930 may be various. For example, the material of the first particles 920 and the second particles 930 may be highly polymer excluding a metal material.

Figure 12:
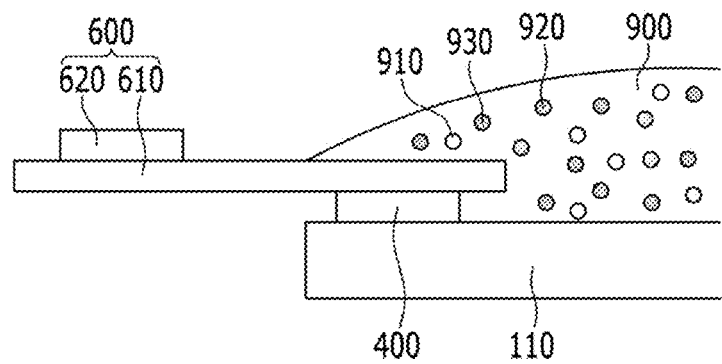

As shown in FIG. 12, the sealant 900 may include the air bubbles 910, the first particles 920, and the second particles 930. The number of the air bubbles 910, the first particles 920, and the second particles 930 per unit area may be about 20/mm² or more. That is, 20 or more of the air bubbles 910, the first particles 920, and the second particles 930 may be located within an area of 1 mm². Preferably, the number of the air bubbles 910, the first particles 920, and the second particles 930 per unit area may be about 100/mm² or more. Since the sealant 900 includes the air bubbles 910, the first particles 920, and the second particles 930, the strength can be increased and damage to the gate pad 400 can be prevented.

In FIG. 9 to FIG. 12, only a boundary portion of the gate pad 400 is shown, but the material included in the sealant 900 located around the data pad 500 may also be variously modified. That is, particles instead of air bubbles may be included inside of the sealant, the sort of the particles may be two or more, and the particles may be included together with the air bubbles.

Subsequently, an effect of a buffer operation owing to the number of the air bubbles 910 per unit area included in the sealant 900 will be described with reference to FIG. 13 to FIG. 15.

FIGS. 13A, 13B, 13C, and 13D are drawings illustrating a sealant of a display device according to an exemplary embodiment. FIGS. 14A, 14B, 14C, and 14D, and FIGS. 15A, 15B, 15C, and 15D illustrate experimental results representing a degree of impact exerted on a lower portion of the sealant. FIGS. 14A, 14B, 14C, and 14H illustrate an experimental result when the impact of about 0.05 MPa to about 0.2 MPa is exerted. FIGS. 15A, 15B, 15C, and 15D illustrate an experimental result when the impact of about 0.5 MPa to about 2.5 MPa is exerted. In the experiment, a pressure sensitive paper is located under the sealant, and the degree of reddening is measured when an impact is exerted on the sealant. It is implied that the more the pressure sensitive paper becomes reddish, the more impact is sensed under the sealant. That is, the more the degree of reddening of the pressure sensitive paper, the more impact is sensed under the sealant.

Figure 13A:
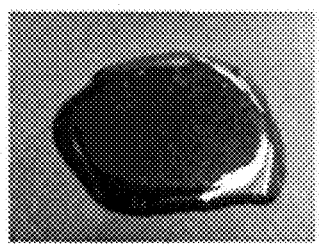
FIGS. 13A, 13B, 13G, and 13D are drawings illustrating a sealant of a display device according to an exemplary embodiment.
Figure 13B:
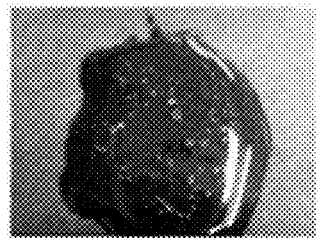
Figure 13C:
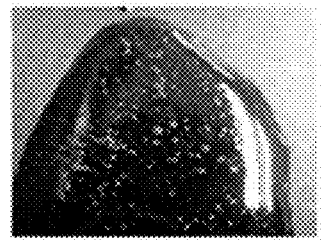
Figure 13D:

FIG. 13A illustrates the case that the number of air bubbles per unit area included in the sealant is about 2 bubbles/mm² to about 3 bubbles/mm². FIG. 13B illustrates the case that the number of air bubbles per unit area included in the sealant is about 7 air bubbles/mm² to about 8 air bubbles/mm². FIG. 13C illustrates the case that the number of air bubbles per unit area included in the sealant is about 20 bubbles/mm². FIG. 13D illustrates the case that the number of air bubbles per unit area included in the sealant is about 100 bubbles/mm².

Figure 14A:
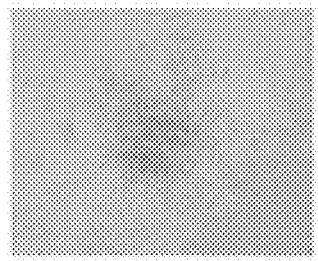
FIGS. 14A, 14B, 14C, and 14D and FIGS. 15A, 15B, 15C, and 15D illustrate experimental results representing a degree of impact exerted on a lower portion of the sealant.
Figure 14B:
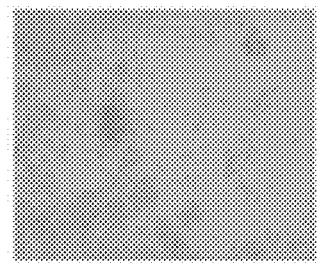
Figure 14C:
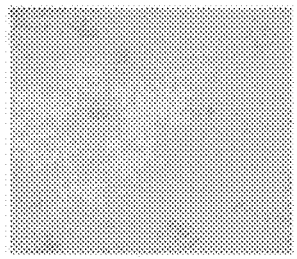
Figure 14D:
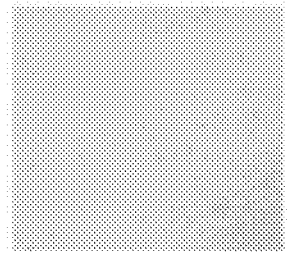

FIG. 14A illustrates the degree of reddening of the pressure sensitive paper when an impact of about 0.05 MPa to about 0.2 MPa is exerted on the sealant shown in FIG. 13A. FIG. 14B illustrates the degree of reddening of the pressure sensitive paper when an impact of about 0.05 MPa to about 0.2 MPa is exerted on the sealant shown in FIG. 13B. FIG. 14C illustrates the degree of reddening of the pressure sensitive paper when an impact of about 0.05 MPa to about 0.2 MPa is exerted on the sealant shown in FIG. 13C. FIG. 14D illustrates the degree of reddening of the pressure sensitive paper when an impact of about 0.05 MPa to about 0.2 MPa is exerted on the sealant shown in FIG. 13D.

Referring to FIGS. 14A, 14B, 14C, and 14D, it can be known that the impact is decreased as the number of the air bubbles per unit area becomes higher. It can be verified that the pressure sensitive paper is hardly reddened if the number of the air hubbies per unit area included in the sealant is about 100 bubbles/mm² or more. Accordingly, if the number of the air bubbles per unit area included in the sealant is about 100 bubbles/mm² or more, an external impact is not delivered to a lower portion of the sealant.

Figure 15A:
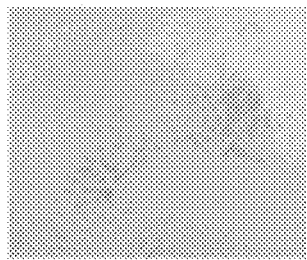
Figure 15B:
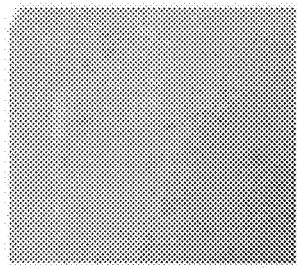
Figure 15C:
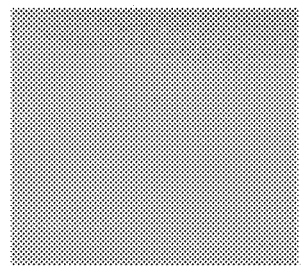
Figure 15D:
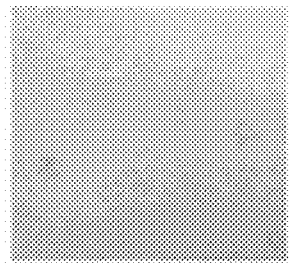

FIG. 15A illustrates the degree of reddening of the pressure sensitive paper when an impact of about 0.5 MPa to about 2.5 MPa is exerted on the sealant shown in FIG. 13A. FIG. 15B illustrates the degree of reddening of the pressure sensitive paper when an impact of about 0.5 MPa to about 2.5 MPa is exerted on the sealant shown in FIG. 13B. FIG. 15C illustrates the degree of reddening of the pressure sensitive paper when an impact of about 0.5 MPa to about 2.5 MPa is exerted on the sealant shown in FIG. 13C. FIG. 15D illustrates the degree of reddening of the pressure sensitive paper when an impact of about 0.5 MPa to about 2.5 MPa is exerted on the sealant shown in FIG. 13D.

Referring to FIGS. 15A, 15B, 15C, and 15D, it can be known that the impact is decreased as the number of the air bubbles per unit area becomes higher. It can be verified that the pressure sensitive paper is hardly reddened if the number of the air bubbles per unit area included in the sealant is about 20 bubbles/mm² or more. Accordingly, if the number of the air bubbles per unit area included in the sealant is about 20 bubbles/mm² or more, an external impact is not delivered to a lower portion of the sealant.

Put together the experimental results of FIGS. 14A, 14B, 14C, and 14D and FIGS. 15A, 15B, 15C, and 15D, when the number of the air bubbles or the particles per unit area is about 20/mm² or more, the damage on the pad located at the lower portion of the sealant can be prevented. Preferably, when the number of the air bubbles or the particles per unit area is about 100/mm² or more, the damage to the pad located at the lower portion of the sealant can be more prevented.

<Description of symbols>

| | |
|---|---|
| 110: substrate | 121: gate line |
| 125: gate pad | 171: data line |
| 177h, 177l: data pad | 191: pixel electrode |
| 195: auxiliary gate pad | 197h, 197l: auxiliary data pad |
| 270: common electrode | 305: microcavity |
| 360: roof layer | 390: encapsulation layer |
| 400: gate pad | 500: data pad |
| 600: gate driver | 700: data driver |
| 900: sealant | 910: air droplet |
| 920: first particle | 930: second particle |

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device, comprising:
a flexible substrate;
a gate line and a data line located on the substrate;
a thin film transistor connected to the gate line and the data line;
a pixel electrode connected to the thin film transistor;
a pad located at an end of the gate line and the data line;
a driver connected to the pad; and
a sealant covering the pad and the driver,
wherein the sealant includes air bubbles or particles therein.

2. The display device of claim 1, further comprising:
a roof layer formed on the pixel electrode to be spaced apart from the pixel electrode with a plurality of microcavities;
a liquid crystal layer filling the microcavities; and
an encapsulation layer located on the roof layer and sealing the microcavities.

3. The display device of claim 2, wherein the sealant contacts the encapsulation layer.

4. The display device of claim 2, wherein a number of the air bubbles or the particles per unit area is more than 20/mm².

5. The display device of claim 2, wherein number of the air bubbles or the particles per unit area is more than 100/mm².

6. The display device of claim 2, wherein the sealant includes the air bubbles and does not include the particles.

7. The display device of claim 2, wherein the sealant includes the particles and does not include the air bubbles.

8. The display device of claim 2, wherein the sealant includes the air bubbles and the particles.

9. The display device of claim 2, wherein the sealant includes at least two kinds of the particles.

10. The display device of claim 2, wherein:
the pad includes a gate pad located at an end portion of the gate line;

the driver includes a gate driver configured to generate gate signals; and the gate driver is connected to the gate pad.

11. The display device of claim 10, wherein the gate driver is comprised of a chip on film.

12. The display device of claim 11, wherein the gate driver includes:

a first circuit board; and a gate driving chip located on the first circuit board.

13. The display device of claim 2, wherein:

the pad includes a data pad located at an end part of the data line;

the driver includes a data driver configured to generate data signals; and the data driver is connected to the data pad.

14. The display device of claim 13, wherein the data driver is comprised of a chip on film.

15. The display device of claim 14, wherein the data driver includes:

a second circuit board; and a data driving chip located on the second circuit board.

16. The display device of claim 1, wherein a number of the air bubbles or the particles per unit area is more than 20/mm$^2$.

17. The display device of claim 1, wherein a number of the air bubbles or the particles per unit area is more than 100/mm$^2$.

* * * * *